United States Patent
Kashima et al.

(10) Patent No.: US 8,991,602 B2
(45) Date of Patent: Mar. 31, 2015

(54) MODULE USED FOR STACKING THIN PLATE PANELS

(75) Inventors: Nobuyuki Kashima, Tokyo (JP); Hiroshi Kobayashi, Tokyo (JP); Takeshi Matsue, Tokyo (JP); Hiroyuki Hashimoto, Kasuya-gun (JP); Koichiro Yoshida, Tokyo (JP)

(73) Assignees: Hitachi Transport System, Ltd., Tokyo (JP); Kyoraku Co., Ltd., Kyoto-shi (JP)

( * ) Notice: Subject to any disclaimer, the term of this patent is extended or adjusted under 35 U.S.C. 154(b) by 16 days.

(21) Appl. No.: 13/993,915

(22) PCT Filed: Dec. 16, 2011

(86) PCT No.: PCT/JP2011/007050
§ 371 (c)(1),
(2), (4) Date: Sep. 3, 2013

(87) PCT Pub. No.: WO2012/081262
PCT Pub. Date: Jun. 21, 2012

(65) Prior Publication Data
US 2013/0334397 A1    Dec. 19, 2013

(30) Foreign Application Priority Data

Dec. 16, 2010 (JP) .................... 2010-281077
Dec. 16, 2010 (JP) .................... 2010-281078

(51) Int. Cl.
| | |
|---|---|
| B65D 85/48 | (2006.01) |
| F16M 13/00 | (2006.01) |
| B65D 57/00 | (2006.01) |
| H01L 21/673 | (2006.01) |
| B65D 81/05 | (2006.01) |
| B65D 85/30 | (2006.01) |
| H01L 31/02 | (2006.01) |

(52) U.S. Cl.
CPC ............ *F16M 13/00* (2013.01); *B65D 57/00* (2013.01); *H01L 21/6734* (2013.01); *B65D 81/057* (2013.01); *B65D 85/30* (2013.01); *H01L 31/02* (2013.01); *B65D 2585/86* (2013.01)
USPC .......... 206/453; 206/509; 206/454; 211/41.1; 211/49.1

(58) Field of Classification Search
USPC ............ 211/50, 49.1, 41.14, 41.1; 206/586, 206/509, 454, 453, 449
See application file for complete search history.

(56) References Cited

U.S. PATENT DOCUMENTS

2006/0005875 A1    1/2006    Haberlein

FOREIGN PATENT DOCUMENTS

| | | |
|---|---|---|
| JP | 55-7790 U | 1/1980 |
| JP | 55-142469 U | 10/1980 |
| JP | 60-41343 U | 3/1985 |
| JP | 61-80261 U | 5/1986 |
| JP | 3042696 U | 10/1997 |
| JP | 2006-21800 A | 1/2006 |
| JP | 2006-32978 A | 2/2006 |

OTHER PUBLICATIONS

International Search Report of PCT/JP20111007050, mailing date of Jan. 24, 2012.

*Primary Examiner* — Anthony Stashick
*Assistant Examiner* — Mollie Llewellyn
(74) *Attorney, Agent, or Firm* — Westerman, Hattori, Daniels & Adrian, LLP

(57) ABSTRACT

The present invention provides a module used for stacking thin panels that allows for stacking of a plurality of thin panels in the vertical direction efficiently and stably. The module includes a sandwiching support portion, a load transmitting portion, and a positioning portion. The sandwiching support portion sandwiches and supports the thin panel. The load transmitting portion is coupled with the sandwiching support portion, and transmits the weight of the thin panel in the vertical direction. The positioning portion relatively positions thin panels, which are stacked in the vertical direction, in the horizontal direction. The sandwiching support portion includes a lower plate-shaped body and a vertical wall. The lower plate-shaped body is disposed on a lower portion of the module. The vertical wall extends upward from an outer edge of the lower plate-shaped body to form an approximately C-shaped cross-sectional surface in conjunction with the lower plate-shaped body. The load transmitting portion includes a load transmitting surface, which is formed outward from an outer surface of the vertical wall. The positioning portion includes an inner lock portion on an inner edge of the lower plate-shaped body and an outer lock portion on the outer edge of the lower plate-shaped body. The inner lock portion is contactable with an inner edge of an upper portion of the module. The outer lock portion is contactable with an outer edge of the upper portion of the module.

2 Claims, 10 Drawing Sheets

MODULE USED FOR STACKING THIN PLATE PANELS

CROSS-REFERENCE TO RELATED APPLICATIONS

The present patent application is a nationalization of International application No. PCT/JP2011/007050, filed Dec. 16, 2011 which is based on, and claims priority from, Japanese Application No. 2010-281077, filed Dec. 16, 2010 and Japanese Application No. 2010-281078, filed Dec. 16, 2010, all of which are incorporated herein by reference in their entireties.

TECHNICAL FIELD

The present invention relates to a module used for stacking thin panels and a method of stacking the thin panels. More specifically, the present invention relates to a module used for stacking thin panels, which allows for stacking of a plurality of thin panels in the vertical direction efficiently and stably, a method of stacking the thin panels with the module, and a module used for stacking thin panels, which allows for stable storage or conveyance of thin panels stacked in the vertical direction in a non-contact manner.

BACKGROUND ART

Conventionally, a module for storing and conveying fragile and heavy thin panels such as solar panels stacked in the vertical direction so as not to contact one another has been used. Patent Document 1 and Patent Document 2 disclose examples of the module.

This module includes a support surface and a molded member. The support surface supports a thin panel from below. A peripheral edge portion of the thin panel is sandwiched by a frame body. The molded member is coupled with the support surface, extends outwardly from the support surface, and transmits the weight of the thin panel in the vertical direction. The molded member includes a recess or a protrusion on each of the upper portion and the lower portion. The recess and the protrusion fit each other. This module is placed at each of the four corners of the thin panel via the frame body so as to rest on each support surface of this module via the frame body. Then, in each corner, the recess at the lower portion of the molded member in a new module fits the protrusion at the upper portion of the molded member in a module that has been already disposed. Similarly, the next thin panel is supported by four modules. Accordingly, the thin panels are allowed to be stacked in the vertical direction in a non-contact manner. However, the following technical problems arise in this module.

Firstly, it is difficult to stack a plurality of the thin panels in the vertical direction stably because a positioning portion for the thin panel and a load transmitting portion for the thin panel are not separated with each other. This problem will be described more specifically as follows. The upper portion and the lower portion of the molded member each form a load transmitting surface. The recess and the protrusion are provided on the upper portion and the lower portion, respectively. The recess on the lower portion of the upper module fits the protrusion on the upper portion of the lower module. This allows for positioning of the upper module in the horizontal direction relative to the lower module. Accordingly, it is difficult to sufficiently ensure load transmitting areas on the upper portion and the lower portion of the molded member because the protrusion and the recess exist. This makes it difficult to stably stack the plurality of the thin panels in the vertical direction.

Secondly, the module requires a considerable amount of material, and this leads to increase in cost because a support portion for the thin panel and the positioning portion for the thin panel are separated with each other. This problem will be described more specifically as follows. As illustrated in FIG. 7 of Patent Document 1, a thin panel without a frame is sandwiched between and supported by a pair of bars 14. Using a cylinder portion 13, which is additionally disposed outside of the pair of bars 14, a dowel 6, which is disposed on the lower portion of the cylinder portion 13 of the upper module, fits a void 8, which is disposed on the upper portion of the cylinder portion 13 of the lower module. This allows for positioning of the upper module in the horizontal direction relative to the lower module. Accordingly, a certain amount of diameter expansion of the cylinder portion 13 is required to stably stack the plurality of thin panels in the vertical direction because the support portion for the thin panel and the load transmitting portion for the thin panel are separated with each other and the cylinder portion 13 particularly also serves as the load transmitting portion. This correspondingly requires an extra amount of material.

Thirdly, it is difficult to efficiently stack the plurality of thin panels in the vertical direction. More specifically, for example, in the case where the thin panels are stacked with the modules on the top surface of a pallet in order to convey the stacked thin panels by a forklift truck, the thin panels cannot be stacked unless the modules are preliminarily positioned at a position corresponding to each of the four corners of the thin panel on site, on the top surface of the pallet. This problem will be described more specifically as follows. Each thin panel is placed on the support surface of the module at each of the four corners and is supported from below. Accordingly, the thin panel cannot be supported unless the support surface of the module is preliminarily prepared at each corner in advance. In this respect, it is difficult to place the module at each of the four corners of the plurality of thin panels in advance and then stack the thin panels, which has the modules at the four corners, on the top surface of the pallet. If one dares to take these steps, stability of the modules stacked in a columnar shape may be degraded when four modules attached to the thin panel are stacked at the same time on the modules, which are already stacked in a columnar shape at each corner on the top surface of the pallet, because each of the modules is not fixed to the corresponding corner portion of the thin panel. This might cause collapse of the modules in a columnar shape depending on the circumstance.

Fourthly, the protection for the thin panels is not sufficient especially when the thin panels with frames are stacked in the vertical direction. This problem will be described more specifically as follows. When the thin panels are stacked or while the thin panels are being stacked, the frame body may be pulled out from the module, and the thin panel and the frame body may together be removed from the module. This may cause damage of the thin panel, and may cause breakage of the thin panel depending on the circumstance. More specifically, as illustrated in FIG. 6 and FIG. 7 of Patent Document 1, when the thin panels are stacked or while the thin panels are being stacked, the thin panel and a frame profile 10 may together be removed from the module because inward movement of the frame profile 10 from the module, which is placed on a panel section 4, is not restricted. In contrast, as for the type illustrated in FIG. 4 of Patent Document 1, inward movement of the frame profile 10 from the module, which is placed on the panel section 4, is restricted by a border section 5, which projects upward from the inner edge of the panel section 4. However, this additionally requires the border section 5 and leads to increase in cost for forming the module.

Patent Document 1: JP-A-2006-32978
Patent Document 2: JP 55-7790 U

DISCLOSURE OF THE INVENTION

Problems to be Solved by the Invention

In view of the technical problems described above, it is an object of the present invention to provide a module used for stacking thin panels, which allows a plurality of thin panels to be efficiently and stably stacked in the vertical direction. In view of the technical problems described above, it is an object of the present invention to provide a module used for stacking thin panels that allows thin panels, which are stacked in the vertical direction in a non-contact manner, to be stably stored or conveyed. In view of the technical problems described above, it is an object of the present invention to provide a module used for stacking thin panels that allows a plurality of thin panels, which are stacked in the vertical direction in a non-contact manner via a frame body placed on a peripheral edge portion of each panel, to be efficiently and stably stacked in the vertical direction. In view of the technical problems described above, it is an object of the present invention to provide a module used for stacking thin panels that does not lead to increase in forming cost and is useful for conveying the thin panels attached to the frame bodies to and from a place for stacking the thin panels, and prevents the frame body from being removed from the module, in the case where the plurality of thin panels are stacked via a frame body placed on a peripheral edge portion of each panel, in the vertical direction.

Solutions to the Problems

To achieve the objective described above, the module used for stacking thin panels according to the present invention includes a sandwiching support portion, a load transmitting portion, and a positioning portion. The sandwiching support portion sandwiches and supports the thin panel. The load transmitting portion is coupled with the sandwiching support portion, and transmits the weight of the thin panel in the vertical direction. The positioning portion relatively positions thin panels, which are stacked in the vertical direction, in the horizontal direction. The sandwiching support portion includes a lower plate-shaped body and a vertical wall. The lower plate-shaped body is disposed on the lower portion of the module. The vertical wall extends upward from the outer edge of the lower plate-shaped body to form an approximately C-shaped cross-sectional surface in conjunction with the lower plate-shaped body. The sandwiching support portion sandwiches and supports the thin panel inserted from an opening of the C-shaped cross-sectional surface. The load transmitting portion includes a load transmitting surface formed outward from the outer surface of the vertical wall. The positioning portion includes an inner lock portion on the inner edge of the lower plate-shaped body and an outer lock portion on the outer edge of the lower plate-shaped body. The inner lock portion is contactable with an inner edge of an upper portion of the module. The outer lock portion is contactable with an outer edge of the upper portion of the module.

Additionally, it is preferred that the positioning portion further include an upper plate-shaped body disposed on the upper portion of the module, and the positioning portion includes the inner lock portion, which is contactable with the inner edge of the upper plate-shaped body, on the inner edge of the lower plate-shaped body, and the outer lock portion, which is contactable with the outer edge of the upper plate-shaped body, on the outer edge of the lower plate-shaped body. Additionally, it is preferred that a middle plate-shaped body be disposed between the upper plate-shaped plate and the lower plate-shaped plate in parallel with both of the plate-shaped bodies, the sandwiching support portion have an approximately C-shaped cross-sectional surface formed by the middle plate-shaped body and the lower plate-shaped body, and the sandwiching support portion sandwich and support the thin panel nakedly inserted between the middle plate-shaped body and the lower plate-shaped body from an opening of the C-shaped cross-sectional surface. It is also preferred that the top surface of the upper plate-shaped body constitute a load receiving surface, the inferior surface of the lower plate-shaped body constitute a load releasing surface, and a longitudinal rib be disposed on the inner surface of the vertical wall to couple the inferior surface of the upper plate-shaped body with the top surface of the middle plate-shaped body.

To achieve the objective described above, the module used for stacking thin panels according to the present invention includes a sandwiching support portion, a load transmitting portion, and a positioning portion. The sandwiching support portion sandwiches and supports the thin panel. The load transmitting portion is coupled with the sandwiching support portion, and transmits the weight of the thin panel in the vertical direction. The positioning portion relatively positions thin panels, which are stacked in the vertical direction, in the horizontal direction. The sandwiching support portion includes an upper plate-shaped body and a vertical wall. The upper plate-shaped body is disposed on the upper portion of the module. The vertical wall extends downward from the outer edge of the upper plate-shaped body to cooperate with the upper plate-shaped body to form an approximately C-shaped cross-sectional surface. The sandwiching support portion sandwiches and supports the thin panel inserted from an opening of the C-shaped cross-sectional surface. The load transmitting portion includes a load transmitting surface formed outward from the outer surface of the vertical wall. The positioning portion includes an inner lock portion, which is contactable with the inner edge of the upper plate-shaped body, on the inner edge of a lower portion of the module, and an outer lock portion, which is contactable with the outer edge of the upper plate-shaped body, on the outer edge of the lower portion of the module.

Additionally, it is preferred that the positioning portion further include a lower plate-shaped body disposed on the lower portion of the module, and the positioning portion include the inner lock portion, which is contactable with the inner edge of the upper plate-shaped body, on the inner edge of the lower plate-shaped body, and the outer lock portion, which is contactable with the outer edge of the upper plate-shaped body, on the outer edge of the lower plate-shaped body.

It is also preferred that a middle plate-shaped body be disposed between the upper plate-shaped plate and the lower plate-shaped plate in parallel with both of the plate-shaped bodies, the sandwiching support portion have an approximately C-shaped cross-sectional surface formed by the middle plate-shaped body and the upper plate-shaped body, and the sandwiching support portion sandwich and support the thin panel nakedly inserted between the middle plate-shaped body and the upper plate-shaped body from an opening of the C-shaped cross-sectional surface.

Additionally, it is preferred that the top surface of the upper plate-shaped body constitutes a load receiving surface, the inferior surface of the lower plate-shaped body constitutes a load releasing surface, and a longitudinal rib be disposed on the inner surface of the vertical wall to couple an inferior surface of the middle plate-shaped body with the top surface of the lower plate-shaped body.

Additionally, it is preferred that the middle plate-shaped body include a recess that forms a notch opening at its inner edge side.

It is also preferred that the sandwiching support portion include the vertical wall coupling the outer edge of the upper plate-shaped body to the outer edge of the lower plate-shaped body to form an approximately C-shaped cross-sectional surface by the upper plate-shaped body and the lower plate-shaped body, and the sandwiching support portion sandwich and support the thin panel inserted between the lower plate-shaped body and the upper plate-shaped body from an opening of the C-shaped cross-sectional surface.

Additionally, it is preferred that the inner lock portion include an inner rim extending downward from the inner edge of the lower plate-shaped body such that the inner rim is contactable with the inner edge of the upper plate-shaped body from inside, and the outer lock portion include an outer rim extending downward from the outer edge of the lower plate-shaped body such that the outer rim is contactable with the outer edge of the upper plate-shaped body from outside.

Additionally, it is preferred that a frame body with a C-shaped cross-sectional surface where an opening faces inward be attached to a peripheral edge portion of the thin panel, the sandwiching support portion sandwich and support the thin panel inserted between the lower plate-shaped body and the upper plate-shaped body from the opening of the C-shaped cross-sectional surface via the frame body, the positioning portion include an inner rim that projects downward from the inner edge of the lower plate-shaped body such that the inner rim is contactable with the inner edge of the upper plate-shaped body from inside, the frame body have the height that allows for being sandwiched by the sandwiching support portion, the frame body have a protruding width such that the frame body is disposed in a state where the frame body is depressed from the inner edge of the upper plate-shaped body toward the vertical wall when the frame body is sandwiched and supported by the sandwiching support portion, and the outer side surface of the inner rim forms means for preventing the frame body from being pulled out from the sandwiching support portion toward the inner rim.

It is also preferred that the frame body be annular, a surface of the thin panel be fixed in a state where the surface of the thin panel abuts against one surface on the inner circumference side that forms a part of the C-shaped cross-sectional surface, and the thin panel be sandwiched and supported by the sandwiching support portion in a state where the surface of the thin panel faces downward such that a space for inserting a finger is ensured between a back surface of the thin panel and the other surface, which forms a part of the C-shaped cross-sectional surface, on the inner circumference side of the frame body.

Additionally, it is preferred that the load transmitting portion have a box structure attached to the outer surface of the vertical wall, the box structure have a rectangular lateral cross-sectional surface that includes a rib inside, which extends in the vertical direction, the top surface of the box structure form a load receiving surface, and the inferior surface of the box structure form a load releasing surface.

Additionally, it is preferred that the box structure be disposed such that the inferior surface of the box structure projects downward from the lower edge of the vertical wall, and the top surface of the box structure is depressed downward from the upper edge of the vertical wall so as to form the outer rim that abuts against the outer edge of the upper plate-shaped body.

It is also preferred that, when the inner rim or the outer rim is brought into abutment with the inner edge of the upper plate-shaped body or the outer edge of the upper plate-shaped body, a predetermined clearance be ensured between the outer rim and the outer edge of the upper plate-shaped body, and between the inner rim and the inner edge of the upper plate-shaped body.

Additionally, it is preferred that the upper plate-shaped body and the lower plate-shaped body each have an L shape with a notch at a corner portion, thereby forming an opening on the vertical wall with an outer edge corresponding to each of notches of the upper plate-shaped body and the lower plate-shaped body and side edges of the vertical wall, which face each other and extend in the vertical direction, and the thin panel be positioned to be in contact with the edges that form the opening and project from the opening when sandwiched and supported by the sandwiching support portion.

Additionally, it is preferred that the box structures be attached to the outer surface of the vertical wall on each side of the opening, and each of the box structures be attached such that the inner surface of the box structure fits the side edge of the opening, and the outer surface of the box structure fits an outer side edge of the vertical wall.

It is also preferred that the top surface of the upper plate-shaped body constitute the load receiving surface, and the inferior surface of the lower plate-shaped body constitute the load releasing surface.

Additionally, it is preferred that a support surface for supporting the thin panel from below be formed on the inner lock portion that is contactable with the inner edge of the upper plate-shaped body. Additionally, it is preferred that the height of the vertical wall be set such that the distance between the support surface and the inferior surface of the upper plate-shaped body is larger than the thickness of the thin panel that is placed on the support surface. It is also preferred that the top surface and the inferior surface of the box structure be inclined surfaces that are in parallel with each other. Additionally, the thin panel may be a rectangular solar panel. Additionally, it is preferred that the module be made of resin and integrally molded.

To achieve the objective described above, the module used for stacking thin panels according to the present invention includes an upper plate-shaped body and a lower plate-shaped body, a sandwiching support portion, a load transmitting portion, and a positioning portion. The upper plate-shaped body and the lower plate-shaped body are in parallel with each other. The sandwiching support portion sandwiches and supports a thin panel. The load transmitting portion is coupled with the sandwiching support portion, and transmits the weight of the thin panel in the vertical direction. The positioning portion relatively positions thin panels, which are stacked in the vertical direction, in the horizontal direction. The sandwiching support portion has a space that is nearly equal to the thickness of the thin panel. The load transmitting portion has a load transmitting surface that is formed outward from the upper plate-shaped body and the lower plate-shaped body. The positioning portion includes an inner lock portion, which is contactable with an inner edge of the upper plate-shaped body of the module, on the inner edge of the lower plate-shaped body, and an outer lock portion, which is contactable with an outer edge of the upper plate-shaped body of the module, on the outer edge of the lower plate-shaped body.

BEST MODE FOR CARRYING OUT THE INVENTION

With an example of rectangular solar panels P as stacked thin panels, a first embodiment of a module 10 according to the present invention will be described in detail below with reference to the accompanying drawings. The solar panel P includes series-connected cells and is in a form of a thin plate, which is protected by resin, reinforced glass, and a metal frame. More specifically, the solar panel P has a laminated structure where the cell made of silicon is implanted between a glass layer and a plastic layer, or between glass layers. The solar panel P has the thickness of a few millimeters, the area of a few square meters, and the weight of 10 to 30 kg. Thus, the solar panel P has a precise and fragile structure. In this embodiment, a description will be given on the case where the outer peripheral edge of the solar panel P is sandwiched by a metal frame body F, and the solar panel P is supported by the module 10 via the metal frame body F.

As illustrated in FIG. 1 to FIG. 5, the module 10 has an axisymmetric shape about the center line X-X (see FIG. 3). The module 10 includes a pair of plate-shaped bodies 16, a vertical wall 18, and a pair of box structures 22. The pair of plate-shaped bodies 16 includes an upper plate-shaped body 12 and a lower plate-shaped body 14, which are coupled with each other in parallel with a gap in the vertical direction. The vertical wall 18 couples the upper plate-shaped body 12 with the lower plate-shaped body 14. The pair of the box structures 22 is attached to an outer surface 20 of the vertical wall 18. The module 10 is made of resin, and these are integrally molded. As described later in detail, the module 10 is placed at each of the four corners of the solar panel P to sandwich and support the solar panel P, and the lower plate-shaped body 14 of the next module 10 is placed on the upper plate-shaped body 12 of each module 10 to support the next solar panel P. This is repeated so as to stack the solar panels P in the vertical direction. Accordingly, the weight of the solar panel P is transmitted through the modules 10 stacked in a columnar shape at each corner. The weight of all of the stacked solar panels P is loaded on the module 10 at the lowest position.

The module 10 includes a resin material of thermoplastic resin that includes amorphous resin, olefin-based resin such as polyethylene and polypropylene, and a similar material. More specifically, the module 10 includes polyolefin (such as polypropylene and high density polyethylene), which is a homopolymer or a copolymer of olefin such as ethylene, propylene, butene, isoprene pentene, and methyl pentene. Since the structure of the module 10 is comparatively complicated, it is appropriate to be integrally molded by injection molding specifically.

The upper plate-shaped body 12 and the lower plate-shaped body 14, which constitute the pair of the plate-shaped bodies 16, each have an L-shape that is notched at a corner portion. The vertical wall 18 is provided to couple an outer edge 31 of the upper plate-shaped body 12 with an outer edge 33 of the lower plate-shaped body 14 such that the upper plate-shaped body 12 and the lower plate-shaped body 14 form an approximately C-shaped cross-sectional surface, as clearly illustrated in FIG. 1 and FIG. 2 in particular. Accordingly, the pair of plate-shaped bodies 16 forms a sandwiching support portion to sandwich and support the solar panel P. The solar panel P is inserted between the upper plate-shaped body 12 and the lower plate-shaped body 14, from the opening of the C-shaped cross-sectional surface, to be sandwiched and supported. In view of this, the distance between the inferior surface of the upper plate-shaped body 12 and the top surface of the lower plate-shaped body 14, the area of the upper plate-shaped body 12, and the area of the lower plate-shaped body 14 may be determined so as to sandwich and support the solar panel P. The module 10 is fixed to the solar panel P by sandwiching and supporting the solar panel P by the module 10 as described above. Accordingly, the solar panel P can be moved in a state where the modules 10 are attached to four corners of the solar panel P, as described later.

An opening 34 is formed at the vertical wall 18. The opening 34 is formed by outer edges 35 and 37, and, side edges 39 and 41 of the vertical wall 18. The outer edges 35 and 37 respectively correspond to the notches of the upper plate-shaped body 12 and the lower plate-shaped body 14. The side edges 39 and 41 of the vertical wall 18 face each other and extend in the vertical direction. Accordingly, the weight of the module 10 is reduced. Moreover, when the solar panel P is sandwiched and supported by the sandwiching support portion, the solar panel P is positioned to project outward from the opening 34 (see FIG. 8) such that the solar panel P is in contact with the edges 35, 37, 39, and 41, which form the opening 34. This allows for stable support of the corner portion of the solar panel P from directly below by the module 10. The upper plate-shaped body 12 and the lower plate-shaped body 14 may each have a rectangular shape instead of the L shape, and may be attached to the intermediate portion of each side of the solar panel P instead of the four corners of the solar panel P. Depending on the circumstance, the modules 10 in the rectangular shape may be attached to the intermediate portion of each side of the solar panel P while the modules 10 in the L shape are attached to the four corners of the solar panel P. Alternatively, a part of the four corners and a part of the intermediate portions of each side may be used at the same time.

The pair of box structures 22 is attached on the outer surface 20 of the vertical wall 18 such that the box structures 22 project downward from the lower edge of the vertical wall 18. The box structure 22 includes a rib 36 inside and has a rectangular cross-section. Each box structure 22 forms a load transmitting portion that includes a load transmitting surface, which is formed outside the outer surface 20 of the vertical wall 18 (see FIG. 3). More specifically, the top surface 37 and the inferior surface 39 of the box structure 22 form inclined surfaces, which are in parallel with each other. The inferior surface 39 projects downward from the lower edge of the vertical wall 18 in such a manner that the closer it is to the opening 34, the lower the inferior surface 39 projects. Correspondingly, the top surface 37 is depressed downward from the upper edge of the vertical wall 18 such that the closer to the opening 34, the lower the top surface 37 depresses. When the solar panels P are stacked, the top surface 37 forms a load receiving surface to receive a load from the upper module 10. On the other hand, the inferior surface 39 forms a load releasing surface to release a load to the lower module 10. One sidewall 38 of the box structure 22 is flush with a side edge 43 of the vertical wall 18, and the other sidewall 40 of the box structure 22 is disposed near the vertical edge 39 of the opening 34. Three ribs 36 are each provided in parallel with the sidewalls 38 and 40 of the box structure 22 and extend in the vertical direction.

The amount of the projection of the inferior surface 39 (amount of depression of the top surface 37) is adjusted to achieve the following operation. When the load releasing surface of the box structure 22 of the upper module 10 is placed on the load receiving surface of the box structure 22 of the lower module 10, by the adjustment of the inclination angle of the inclined surface, the lower plate-shaped body 14 of the upper module 10 is placed on the upper plate-shaped body 12 of the lower module 10, while at the same time, the top surface of the upper plate-shaped body 12 can serve as the load receiving surface as well as the load receiving surface of the box structure 22, while, on the other hand, the inferior surface of the lower plate-shaped body 14 can serve as the load releasing surface as well as the load releasing surface of the box structure 22. Accordingly, the areas of the top surface 37 and the inferior surface 39, the thickness and the number of the ribs 36 in the box structure 22, or the like may be determined, in view of the above aspect. As a modification, the load transmitting surface may be formed by the top surface 37 and the inferior surface 39 of the box structure 22 alone depending on the weight, the size, or other properties of the solar panel P.

A description will be given on the positioning of the module 10 in the horizontal direction when the modules 10 are stacked in the vertical direction. As illustrated in FIG. 6, a projecting inner surface 42 of the box structure 22 forms an outer rim 44 of the module 10, which is in contact with the outer edge 31 of the upper plate-shaped body 12 from outside. On the other hand, the outer surface 20 of the vertical wall 18 is in contact with the projecting inner surface 42. Correspondingly, as illustrated in FIG. 7, an inner rim 46, which is in contact with the inner edge 30 of the upper plate-shaped body 12 from inside, is provided to extend downward from the inner edge 45 of the lower plate-shaped body 14. To reinforce a lower edge 49 of the inner rim 46, a reinforcing plate 51 that extends in parallel with the lower plate-shaped body 14 from the lower edge 49 is attached. For smooth insertion of the solar panel P from the opening of the C-shaped cross-sectional surface, a slope (not shown), which inclines downward to the box structure 22 may be disposed near both end portions of the inner rim 46 of the top surface of the lower plate-shaped body 14.

More specifically, the positioning of the upper module 10 in the horizontal direction relative to the lower module 10 is performed as follows. When the modules 10 are stacked such that the inferior surface 28 of the lower plate-shaped body 14 of the next module 10 abuts against the top surface 26 of the upper plate-shaped body 12 of the module 10, the projecting inner surface 42 of the box structure 22 of the upper module 10 abuts against the outer surface 20 of the vertical wall 18 of the lower module 10. This restricts inward movement of the upper module 10 relative to the lower module 10. On the other hand, the inner rim 46 of the upper module 10 abuts against the inner edge 30 of the upper plate-shaped body 12 of the lower module 10. This restricts outward movement of the upper module 10 relative to the lower module 10. As described above, both the upper plate-shaped body 12 and the lower plate-shaped body 14 are formed to be L-shaped. Correspondingly, both the outer rim 44 and the inner rim 46 are formed to be L-shaped. This allows for restriction in two directions orthogonal to each other on the horizontal surface. More specifically, the outer rim 44 restricts inward movement of the upper module 10 relative to the lower module 10, in two directions orthogonal to each other. On the other hand, the inner rim 46 restricts outward movement of the upper module 10 relative to the lower module 10, in two directions orthogonal to each other.

As described later, when a plurality of solar panels P are stacked in the vertical direction using these modules 10, inward and outward relative movement in the horizontal direction of the modules 10 that are stacked in the vertical direction and adjacent to each other is possible as follows. Each of the four corners of each solar panel P are preliminarily sandwiched and supported by the module 10 in parallel. When the inner rim 46 abuts against the inner edge 30 of the upper plate-shaped body 12, or the outer rim 44 abuts against the outer edge 31 of the upper plate-shaped body 12, a predetermined clearance is ensured between the outer rim 44 and the outer edge 31 of the upper plate-shaped body 12, and between the inner rim 46 and the inner edge 30 of the upper plate-shaped body 12, in order to make it easier to stack each solar panel P, which has the modules 10 at each of the four corners, for example, on the top surface of a pallet. The size of the clearance may be determined, in view of the above aspect and from the aspect of the stability of the solar panels P to be stacked. For example, it may be a few millimeters.

As a modification, the inner rim 46, which extends upward from the inner edge 30 of the upper plate-shaped body 12 so as to abut against the inner edge 45 of the lower plate-shaped body 14 from inside, and the outer rim 44, which extends upward from the outer edge 31 of the upper plate-shaped body 12 so as to abut against the outer edge 33 of the lower plate-shaped body 14 from outside, may be included. In this case, the box structure 22 is disposed such that the top surface 37 projects upward from the upper edge of the upper plate-shaped body 12. This forms the outer rim 44, which abuts against the outer edge 33 of the lower plate-shaped body 14.

An operation of the module 10 thus configured will be described below by describing a method of stacking the solar panels P in the vertical direction with the modules 10. A description will be given on an example in the case where the solar panels P are stacked in the vertical direction on the top surface of a pallet in order to stack a plurality of solar panels P in the vertical direction and convey that by a forklift truck. First, the module 10 is placed in parallel at each of the four corners of each of a plurality of solar panels P to be stacked. More specifically, the solar panel P is inserted between the lower plate-shaped plate 14 and the upper plate-shaped plate 12 from the opening of the C-shaped cross-sectional surface of the module 10 so as to be sandwiched. Accordingly, the module 10 is fixed to the solar panel P. In this case, as illustrated in FIG. 8, the corner portion of the solar panel P is positioned to project outward from the opening 34 such that the corner portion of the solar panel P is in contact with the edges 35, 37, 39, and 41, which constitute the opening 34 of the module 10. This allows for stable support of the corner portion of the solar panel P from directly below by the module 10. If the above-described process is performed on each solar panel P in parallel such that the solar panels P, which have the modules 10 placed at the four corners, are prepared, a process of placing the modules 10 at the four corners of the solar panel P on the top surface of the pallet can be eliminated. Accordingly, the solar panels P can be stacked efficiently.

Next, a plurality of solar panels P, which has the modules 10 at four corners, is sequentially stacked such that the modules 10 are stacked in a columnar shape at each corner. More specifically, the modules 10 are stacked at each corner portion such that, at each corner, the inferior surface 39 of the box structure 22 of the next module 10 is placed on the top surface 37 of the box structure 22 of the module 10 at the top, which is placed on the top surface of the pallet, while at the same time the inferior surface 28 of the lower plate-shaped body 14 of the next module 10 is brought into abutment with the top surface 26 of the upper plate-shaped body 12 of the module 10.

In this case, when the solar panel P is stacked on the solar panel P at the top, four modules 10, each of which is attached to corresponding corner of the solar panel P, are positioned simultaneously relative to the corresponding modules 10 at the top. A predetermined clearance is ensured between the inner edge 30 and the inner rim 46 of the upper plate-shaped body 12 of the module 10 at the top, and the outer edge 31 and the outer rim 44 of the lower plate-shaped body 14 of the next module 10. This makes it easier to perform this process.

By repeating the above-described process, a plurality of modules 10 is stacked in a columnar shape at each of the four corners of the plurality of solar panels P. This allows for stacking of the plurality of solar panels P in the vertical direction. Then, the plurality of solar panels P stacked in the vertical direction is conveyed together with a pallet at the bottom, for example, by a forklift truck. This allows for storage of the stacked solar panels P in a predetermined place.

In the storage place, the stacked solar panels P are efficiently unstacked with an inverse procedure of the stacking procedure. More specifically, the solar panel P may be unstacked from the pallet in a state where the solar panel P has the modules 10 at the four corners, then the modules 10 may be removed from the plurality of solar panels P in another place in parallel.

The module 10 used for stacking the solar panels P thus configured allows for stacking of the solar panels P in the vertical direction efficiently and stably as follows. The solar panel P is inserted between the lower plate-shaped body and the upper plate-shaped body from the opening of the C-shaped cross-sectional surface of the sandwiching support portion, so as to be sandwiched and supported. The upper solar panel P that is sandwiched and supported by the modules 10 is placed on the lower solar panel P that is sandwiched and supported by the modules 10, while at the same time the load transmitting surface of the upper module 10 is placed on the load transmitting surface of the lower module 10, and a lock portion provided on the edge of the lower plate-shaped body or the upper plate-shaped body of the upper module 10 is brought into abutment with the edge of the upper plate-shaped body or the lower plate-shaped body of the upper module 10. Accordingly, the upper module 10 is positioned in the horizontal direction relative to the lower module 10.

The method of stacking the solar panels P thus configured allows for stacking of the solar panels P efficiently and stably as follows. Each of the modules 10 is preliminarily attached to the corresponding corner of the four corners of a plurality of solar panels P to be stacked, in parallel. The solar panels P, which have the modules 10 at each of the four corners, are positioned in the horizontal direction using the positioning portions between the upper and lower modules 10 such that the modules 10 are stacked in a columnar shape at each corner of the solar panels. Thus, the solar panels P can be sequentially stacked in the vertical direction while the upper solar panel P is positioned in the horizontal direction relative to the lower solar panel P. Accordingly, for example, in the case where the solar panels P are stacked on the top surface of a pallet to be conveyed by a forklift truck, the modules 10 are allowed to be preliminarily attached to each of the plurality of solar panels P to be stacked on site in parallel, without stacking the upper module 10 on the lower module 10 at each of the four corners and then placing the solar panel P on the upper modules 10, one by one for each of the solar panels P, unlike in a conventional way.

A second embodiment of the present invention will be described in detail below. In the following description, like reference numerals designate elements corresponding or identical to those in the first embodiment, and such elements will not be further elaborated here. A description will be given on features of this embodiment in detail.

A module 10 according to this embodiment has following features. The module 10 is used for stacking thin panels P that are more lightweight than those in the first embodiment, and need to be stacked in such a way that the thin panels P, which are adjacent in the vertical direction, are not in contact with each other at all. Correspondingly, the thin panels P are characterized in its supporting configuration. Accordingly, the module 10 has a different structure in a support portion for the thin panel P and a load transmitting portion for a load of the thin panel P. The support portion for the thin panel P has a support surface 24, which extends inward from the inner rim 46, in order to place the thin panel P on the support surface 24, differently from the first embodiment. As for the load transmitting portion for a load of the thin panel P, the upper plate-shaped body 12 and the lower plate-shaped body 14 mainly serve as load transmitting surfaces instead of the top surface 37 and the inferior surface 39 of the box structure 22, differently from the first embodiment. The top surface 37 of the box structure 22 is depressed downward from the upper edge of the upper plate-shaped body 12 while the inferior surface 39 of the box structure 22 projects downward from the lower edge of the lower plate-shaped body 14. This allows the box structure 22 to serve as a positioning portion for the thin panel P.

More specifically, as illustrated in FIG. 9, the support surface 24 for the thin panel P is provided on the lower plate-shaped body 14. Each of the modules 10 are attached to corresponding one of the four corners of the thin panel P such that the support surfaces 24 support the thin panel P from below, and then the lower plate-shaped body 14 of the next module 10 is placed on the upper plate-shaped body 12 of the corresponding module 10 such that the next thin panel P is supported. This process is repeated to stack the thin panels P in the vertical direction so as not to contact one another. Accordingly, the weight of the thin panel P is transmitted from the support surface 24, which supports the thin panel P from below, through the lower plate-shaped body 14 of the module 10, and, the upper plate-shaped body 12 and the vertical wall 18 of the modules 10 at the lower positions. The weight of the thin panels P supported by the modules 10 at the lower positions is added and transmitted to the modules 10 at the further lower positions. The weight of all of the stacked thin panels P is loaded on the module 10 at the lowest position.

The pair of plate-shaped bodies 16 is coupled with the support surface 24 and extends outward from the support surface 24 to form the load transmitting surface, which transmits the weight of the thin panel P in the vertical direction. More specifically, the top surface 26 of the upper plate-shaped body 12 receives a load from the modules 10 at the upper positions and serves as the load receiving top surface 26, and the inferior surface 28 of the lower plate-shaped body 14 releases the load to the modules 10 at the lower positions and serves as the load releasing inferior surface 28. Accordingly, areas of the pair of plate-shaped bodies 16 may be each determined, in view of the load transmitting surface.

As described later, from the aspect of the positioning of the upper and lower modules 10 in the horizontal direction when the modules 10 are stacked such that the inferior surface 28 of the lower plate-shaped body 14 of the next module 10 is brought into abutment with the top surface 26 of the upper plate-shaped body 12 of the module 10, a notch 32 corresponding to the support surface 24 of the lower plate-shaped body 14 is provided on the inner edge 30 of the upper plate-shaped body 12. The notch 32 allows a space to be secured above the support surface 24 when the thin panel P is placed on the support surface 24 of the lower plate-shaped body 14, thus making it easier to place the thin panel P on the support surface 24. The support surface 24 has an approximately triangular shape, which is appropriate to support the corner portion of the thin panel P. The pair of plate-shaped bodies 16 has a dog-leg shape. The area of the support surface 24 may be determined, taking the weight and bending rigidity of the thin panel P to be supported into consideration, such that an amount of deflection of the thin panel P, which occurs in the case where each of the four corners of the thin panel P is supported by the support surface 24, is within an acceptable range. The inner rim 46 is coupled with the support surface 24 such that the inner surface of the inner rim 46 can abut against a corner of the thin panel P, which is placed on the support surface 24.

The height of the vertical wall 18 may be determined such that the distance between the support surface 24 and the inferior surface 28 of the upper plate-shaped body 12 is larger than the thickness of the thin panel P, which is placed on the support surface 24 (see FIG. 10). The vertical wall 18 has an opening 34 in a rectangular shape at the intersection portion of the dog-leg shape, in view of reducing weight. When the thin panel P is placed on the support surface 24 of the module 10, the opening 34 makes it easier to visually check how the thin panel P is placed. In the case where the weight of the thin panel P requires compression rigidity of the module 10, the opening 34 may be omitted and the vertical wall 18 may be provided, instead.

The top surface 37 and the inferior surface 39 of the box structure 22 form inclined surfaces that are in parallel with each other. When a plurality of modules 10 is stacked such that the inferior surface 28 of the lower plate-shaped body 14 of the next module 10 is in abutment with the top surface 26 of the upper plate-shaped body 12 of the module 10, the inferior surface 39 of the box structure 22 of the upper module 10 is in abutment with the top surface 37 of the corresponding box structure 22 of the lower module 10. Accordingly, the areas of the top surface 37 and the inferior surface 39, the thickness and the number of the ribs 36 in the box structure 22, or the like may be determined from this aspect. Depending on the weight and the size of the thin panel, a clearance may be provided between the inferior surface 39 of the upper box structure 22 and the top surface 37 of the lower box structure 22, when the inferior surface 28 of the lower plate-shaped body 14 of the next module 10 is brought into abutment with the top surface 26 of the upper plate-shaped body 12 of the module 10.

An operation of the module 10 thus configured will be described below by describing a method of stacking the solar panels P in the vertical direction with the modules 10. Firstly, a wooden pallet or a resin-made pallet, which has insertion spaces for metal forks of a forklift truck, is prepared. On the top surface of the pallet, each of the modules 10 is attached to corresponding one of the four corners of the thin panel P, which fits a metal frame body F around its outer peripheral edge. More specifically, the corner portions of the metal frame body F are placed on the support surfaces 24 of each module 10 placed on the top surface of the pallet. Thus, one thin panel P is supported by four modules 10.

Subsequently, the next module 10 is placed on each module 10 placed on the top surface of the pallet. More specifically, each of the modules 10 is stacked at the corresponding corner portion such that the inferior surface 28 of the lower plate-shaped body 14 of the next module 10 is in abutment with the top surface 26 of the upper plate-shaped body 12 of the corresponding module 10 placed on the top surface of the pallet. In this case, the sufficient area is ensured for the plate-shaped body 16 and inward and outward movement of the upper module 10 relative to the lower module 10 is restricted. Accordingly, the upper module 10 can be stably stacked on the lower module 10. This allows the thin panels P to be stably stacked with the module 10 so as not to contact one another. By repeating the above-described process, as illustrated in FIG. 10, the plurality of modules 10 is stacked in a columnar shape at each of the four corners of the plurality of thin panels P. This allows for stacking of the plurality of thin panels P in the vertical direction so as not to contact one another.

In this embodiment, it is necessary to prepare the support surface 24 on which the thin panel P is placed, on the top surface of the pallet, differently from the first embodiment. This requires the modules 10 to be sequentially stacked at each corner on the top surface of the pallet. Accordingly, this embodiment is inferior to the first embodiment in the aspect of efficiency of stacking the thin panels P. However, this embodiment allows the thin panels P to be stacked so as not to contact one another at all, differently from the first embodiment. This also reduces influence of vibration during conveyance or other factors.

Next, the plurality of thin panels P stacked in the vertical direction can be conveyed with the pallet at the bottom, for example, by a forklift truck, and stored in a predetermined place with the pallet. In this case, as for the upper and lower modules 10, which are adjacent to each other in the vertical direction, the lower module 10 stably supports the upper module 10 with the sufficient load supporting area, which is formed by the plate-shaped body 16 and the box structure 22, and horizontal movement of both of the modules 10 is restricted and both of the modules 10 are positioned with the outer rim 44 and the inner rim 46. This allows for stable conveyance of the modules 10 stacked in a columnar shape, and the thin panels P supported by these modules 10, even if certain vibration occurs during conveyance in particular.

The above-described configuration allows the thin panels to be stacked in the vertical direction so as not to contact one another with the load transmitting function of the module 10 as follows. Each of the modules 10 is attached to corresponding one of the four corners of the thin panel. The thin panel is placed and supported on the support surface 24 of each module 10. At each corner, a new module 10 is stacked on the corresponding module 10, which has been already placed, aside of the thin panel such that both load transmitting surfaces are in abutment with each other. Then the next thin panel is supported by four modules 10 in a similar way. On the other hand, between the upper module 10 and the lower module 10 adjacent to each other in the vertical direction, the inner lock portion of the upper module 10 abuts against the inner edge 30 of the load transmitting surface of the lower module 10 from inside. This restricts outward movement of the upper module 10 relative to the lower module 10, while at the same time the outer lock portion of the upper module 10 abuts against the outer edge 31 of the load transmitting surface of the lower module 10 from outside. This restricts inward movement of the upper module 10 relative to the lower module 10. This restricts horizontal movement of the modules 10, which are adjacent to each other in the vertical direction, relative to each other, based on the positioning function of the module 10.

A third embodiment of the present invention will be described in detail below. In the following description, like reference numerals designate elements corresponding or identical to those in the first embodiment, and such elements will not be further elaborated here. A description will be given on features of this embodiment in detail.

This embodiment has following features. A solar panel P with a metal frame body is a target of this embodiment. In the case where the solar panel P with the metal frame body is sandwiched and supported by the modules, this embodiment prevents the solar panel P from being pulled out from a sandwiching support portion together with the metal frame body. Namely, as for the solar panel P, which is supported by the sandwiching support portion of the lower module 10 via the metal frame body F, using the inner rim 46, which has a positioning function for the position of the upper module 10 relative to the lower module 10, this embodiment prevents the case where the metal frame body F is pulled out from the sandwiching support portion of the lower module 10, and the solar panel P is removed from the lower module 10 together with the metal frame body F. More specifically, when the metal frame body F is sandwiched and supported by the sandwiching support portion, an outer surface 55 of the inner rim 46 forms means for preventing the metal frame body F from being pulled out from the sandwiching support portion toward the inner rim 46 because the metal frame body F has the protruding width W such that the metal frame body F is depressed from the inner edge 30 of the upper plate-shaped body 12 toward the vertical wall 18.

More specifically, the metal frame body F is made of, for example, aluminum, and is rectangular annular-shaped corresponding to the rectangular outline of the solar panel P. The metal frame body F has a C-shaped cross-sectional surface where an opening faces inward. More specifically, as illustrated in FIG. 11, the metal frame body F has the height H, which allows for being sandwiched by the sandwiching support portion of the module 10, and the protruding width W such that the metal frame body F is disposed in a state where the metal frame body F is depressed from the inner edge 30 of the upper plate-shaped body 12 toward the vertical wall 18 when being sandwiched and supported by the sandwiching support portion. The surface of the solar panel P is fixed in a state where the surface of the solar panel P is in abutment with one surface 51 on the inner circumference side of the metal frame body F, which inner circumference forms a part of the C-shaped cross-sectional surface. The solar panel P is sandwiched and supported by the sandwiching support portion in a state where the above surface of the solar panel P faces downward. Thus a space S for inserting a finger is ensured above the solar panel P, between a back surface U of the solar panel P and the other surface 53 on the inner circumference side of the metal frame body F which inner circumference forms a part of the C-shaped cross-sectional surface. Accordingly, when the solar panels P are stacked in the vertical direction, this avoids a problem where the upper module 10 collides with the metal frame body F of the solar panel P, which is sandwiched and supported by the lower module 10, to interfere with stacking of the upper module 10 on the lower module 10. While the solar panels P are stacked in the vertical direction, the outer surface 55 of the inner rim 46 of the upper module 10 prevents the metal frame body F of the solar panel P on the lower module 10 from being pulled out from the sandwiching support portion toward the inner rim 46, and prevents the solar panel P from being removed from the module 10 together with the metal frame body F. The amount of depression from the inner edge 30 may be determined from this aspect.

When a plurality of solar panels P are stacked in the vertical direction using these modules 10, inward and outward relative movement in the horizontal direction of the stacked modules 10 that are adjacent to each other in the vertical direction is possible as follows. Each of the four corners of each solar panel P is preliminarily sandwiched and supported by the module 10 via the metal frame body F in parallel. When the inner rim 46 or the outer rim 44 is brought into abutment with the inner edge 30 of the upper plate-shaped body 12 or the outer edge 31 of the upper plate-shaped body 12, a predetermined clearance is ensured between the outer rim 44 and the outer edge 31 of the upper plate-shaped body 12, and between the inner rim 46 and the inner edge 30 of the upper plate-shaped body 12, in order to make it easier to stack each solar panel P, which has the modules 10 at each of the four corners, for example, on the top surface of a pallet. The size of the clearance may be determined from this aspect and from the aspect of the stability of the solar panels P to be stacked. For example, it may be a few millimeters.

When the solar panel P is stacked on the solar panel P at the top, four modules 10, each of which is attached to corresponding one of the four corners of the solar panel P, are positioned simultaneously, relative to the corresponding modules 10 at the top. The space S is ensured between the other surface 53 on the inner circumference side of the metal frame body F and the back surface U of the solar panel P. The space S allows a conveyer to insert a finger into the space S and hold the solar panel P, and makes it easier to convey the solar panel P to the place for stacking. A predetermined clearance is ensured between the inner edge 30 of the upper plate-shaped body 12 of the module at the top and the inner rim 46 of the lower plate-shaped body 14 of the next module 10, or the outer edge 31 of the upper plate-shaped body 12 of the module and the outer rim 44 of the lower plate-shaped body 14 of the next module 10. This makes it easier to perform this process. During storage, in the case where the metal frame body F moves to the direction where the metal frame body F is pulled out from the sandwiching support portion toward the inner rim 46, the metal frame body F is brought into contact with the outer surface 55 of the inner rim 46. This prevents the metal frame body F from being pulled out. In the storage place, the stacked solar panels P are efficiently unstacked with an inverse procedure of the stacking procedure. More specifically, the solar panel P may be unstacked from the pallet in a state where the solar panel P has the modules at the four corners, then the modules may be removed from the plurality of solar panels P in another place in parallel. In this case, similarly to conveyance to the place for stacking, a conveyer is able to insert a finger into the space S to hold the solar panel P, and easily convey the solar panel P to the place for unstacking.

The module used for stacking thin panels thus configured allows the upper module to be positioned in the horizontal direction relative to the lower module, as follows. The thin panel is fitted in the frame body with the C-shaped cross-sectional surface around the peripheral edge portion, from the opening of the C-shaped cross-sectional surface. The thin panel with the frame body is inserted between the lower plate-shaped body and the upper plate-shaped body via the frame body, so as to be sandwiched and supported. The upper thin panel that is sandwiched and supported by the modules is placed on the lower thin panel that is sandwiched and supported by the modules in such a way that the load transmitting surface of the upper module is placed on the load transmitting surface of the lower module, while at the same time the inner rim, which projects downward from the inner edge of the lower plate-shaped body of the upper module is brought into abutment with the inner edge of the upper plate-shaped body of the lower module, from inside.

In this case, the frame body has the height, which allows for being sandwiched by the sandwiching support portion, and has the protruding width such that the frame body is disposed in a state where the frame body is depressed from the inner edge of the upper plate-shaped body toward the vertical wall when being sandwiched and supported by the sandwiching support portion. Accordingly, when the thin panels are stacked in the vertical direction, this avoids a problem where the upper module collides with the frame body of the thin panel, which is sandwiched and supported by the lower module, to interfere with stacking of the upper module on the lower module. While the thin panels are stacked in the vertical direction, the outer side surface of the inner rim of the upper module prevents the frame body of the thin panel on the lower module from being pulled out from the sandwiching support portion toward the inner rim and prevents the thin panel from being removed from the module together with the frame body. This allows the thin panels to be efficiently and stably stacked in the vertical direction.

Fourth Embodiment

A fourth embodiment of the present invention will be described in detail below. In the following description, like reference numerals designate elements corresponding or identical to those in the first embodiment, and such elements will not be further elaborated here. A description will be given on features of this embodiment in detail.

A module 10 according to this embodiment has following features. A thin panel P without a frame body is a target of this embodiment. The module 10 according to this embodiment is a modification of the module according to the first embodiment. Specifically, a middle plate-shaped body 202 is disposed between the upper plate-shaped body 12 and the lower plate-shaped body 14, and longitudinal ribs 204 are disposed to extend between the upper plate-shaped body 12 and the middle plate-shaped body 202. As illustrated in FIG. 12 and FIG. 13, the middle plate-shaped body 202 cooperates with the lower plate-shaped body 14 to sandwich the thin panel from above. The middle plate-shaped body 202 is disposed in parallel with the upper plate-shaped body 12 and the lower plate-shaped body 14. The middle plate-shaped body 202 is approximately L-shaped similarly to the upper plate-shaped body 12 and the lower plate-shaped body 14. The middle plate-shaped body 202 is disposed to spread inward from the inner surface of the vertical wall 18. In the first embodiment, the upper plate-shaped body 12, the lower plate-shaped body 14, and the vertical wall 18 form the approximately C-shaped cross-sectional surface. In this embodiment, the middle plate-shaped body 202, the lower plate-shaped body 14, and the vertical wall 18 form the approximately C-shaped cross-sectional surface, and the thin panel without the frame body is inserted between the middle plate-shaped body 202 and the lower plate-shaped body 14, from the opening of the C-shaped cross-sectional surface, so as to be sandwiched and supported. The installation level of the middle plate-shaped body 202 between the upper plate-shaped body 12 and the lower plate-shaped body 14 may be determined from this aspect.

To reduce the use of resin, and reduce friction with the thin panel when the thin panel is sandwiched, a recess 205 with a notch, which opens at an inner edge 203 side, is disposed in the center of the middle plate-shaped body 202. It is preferred that the size of the recess 205 be as large as possible insofar as the middle plate-shaped body 202 is able to sandwich and support the thin panel. In this embodiment, similarly to the first embodiment, the box structure 22 forms a load transmitting portion. In addition, the top surface of the upper plate-shaped body 12 forms a load receiving surface together with the top surface 37 of the box structure 22. On the other hand, the inferior surface of the lower plate-shaped body 14 forms a load releasing surface together with the inferior surface 39 of the box structure 22.

In this respect, the longitudinal rib 204 is a reinforcing rib to support a load that is applied to the upper plate-shaped body 12 of the lower module 10. The load of the thin panel is applied via the lower plate-shaped body 14 of the upper module 10 in the modules 10, which are adjacent to each other in the vertical direction, during stacking of the thin panels. Thus, the upper end of the longitudinal rib 204 extends from the outer edge 35 to the inner edge 30 on the inferior surface of the upper plate-shaped body 12. The side edge of the longitudinal rib 204 is fixed to the inner surface of the vertical wall 28. The lower end of the longitudinal rib 204 extends to the top surface of the middle plate-shaped body 202. In this embodiment, three longitudinal ribs 204 are disposed on each side of the opening 34. The thickness and the number of the longitudinal ribs 204 may be determined from this aspect.

Differently from the first embodiment, when the thin panels are stacked, it is possible to visually check how the thin panels are stacked, through the opening 34 between the upper plate-shaped body 12 and the middle plate-shaped body 202, from outside.

The module 10 according to this embodiment is integrally molded as follows. Both the module for sandwiching and supporting a thin panel without a frame body and the module for sandwiching and supporting a thin panel with a frame body can be formed by simply commonalizing a mold for forming and using what is called an insert. For example, in the case of a thin panel with a frame body, which is thicker, the module is integrally molded as the module 10 according to the first embodiment, without the middle plate-shaped body 202 and the longitudinal rib 204. In the case of a thin panel without a frame body, which is thinner, the insert is used as described in this embodiment. The insert is set in a cavity of a mold for forming. The insert includes a portion for forming the middle plate-shaped body 202 and the longitudinal rib 204. This allows for molding of different types of the modules easily, without preparing an additional new mold for forming.

The embodiments of the present invention are described in detail above. A person skilled in the art may make various modifications and changes insofar as they are not out of the scope of the present invention. For example, in this embodiment, a description will be given on the case where the outer peripheral edge of the solar panel P is fitted in the metal frame body F, and the modules 10 support each of the four corners of the metal frame body F to support the solar panel P. This should not be construed in a limited sense. For example, the solar panel P may be supported directly by the modules 10 without using the metal frame body F. This allows for lowering of the height of each of used modules 10, and is effective for the case where the largest possible number of solar panels P is stored in a space that has height limitation, for example.

Additionally, while in this embodiment, the same modules 10 are used and stacked in a columnar shape at each of the four corners of a plurality of solar panels P, in order to stack a plurality of solar panels P in the vertical direction, this should not be construed in a limited sense. The lower module 10 supports the larger number of solar panels P. This requires the increased strength that much. Therefore, the modules 10 with the same outer shape but different thickness may be prepared, and the thicker module 10 may be used for the module 10 at the lower layer. Furthermore, while in the first embodiment, a description will be given on the case where the thin panel is supported by a pair of plate-shaped bodies, each of which has a C-shaped cross-sectional surface, this should not be construed in a limited sense. For example, when stacking a plurality of thin panels, a part of the thin panels may be sandwiched and supported by pairs of plate-shaped bodies 16, each of which has a C-shaped cross-sectional surface, and a part of the thin panels may be placed on the support surface 24 of the lower plate-shaped body 14.

Additionally, in the fourth embodiment, a description will be given on the case where the thin panel without the frame body is sandwiched between the middle plate-shaped body 202 and the lower plate-shaped body 14, and the longitudinal rib 204 supports the load that is applied to the upper plate-shaped body 12 of the lower module via the lower plate-shaped body 14 of the upper module. However, this should not be construed in a limited sense. The longitudinal rib 204 may be omitted in the case where the thin panel without the frame body is lightweight. Alternatively, a plurality of middle plate-shaped bodies 202 may be disposed between the upper plate-shaped body 12 and the lower plate-shaped body 14, and the thin panel may be sandwiched between the adjacent middle plate-shaped bodies 202, which are adjacent to each other in the vertical direction, in order to hold a plurality of thin panels with one set of four modules 10 at the same level.

DESCRIPTION OF REFERENCE SIGNS

Figure 1:
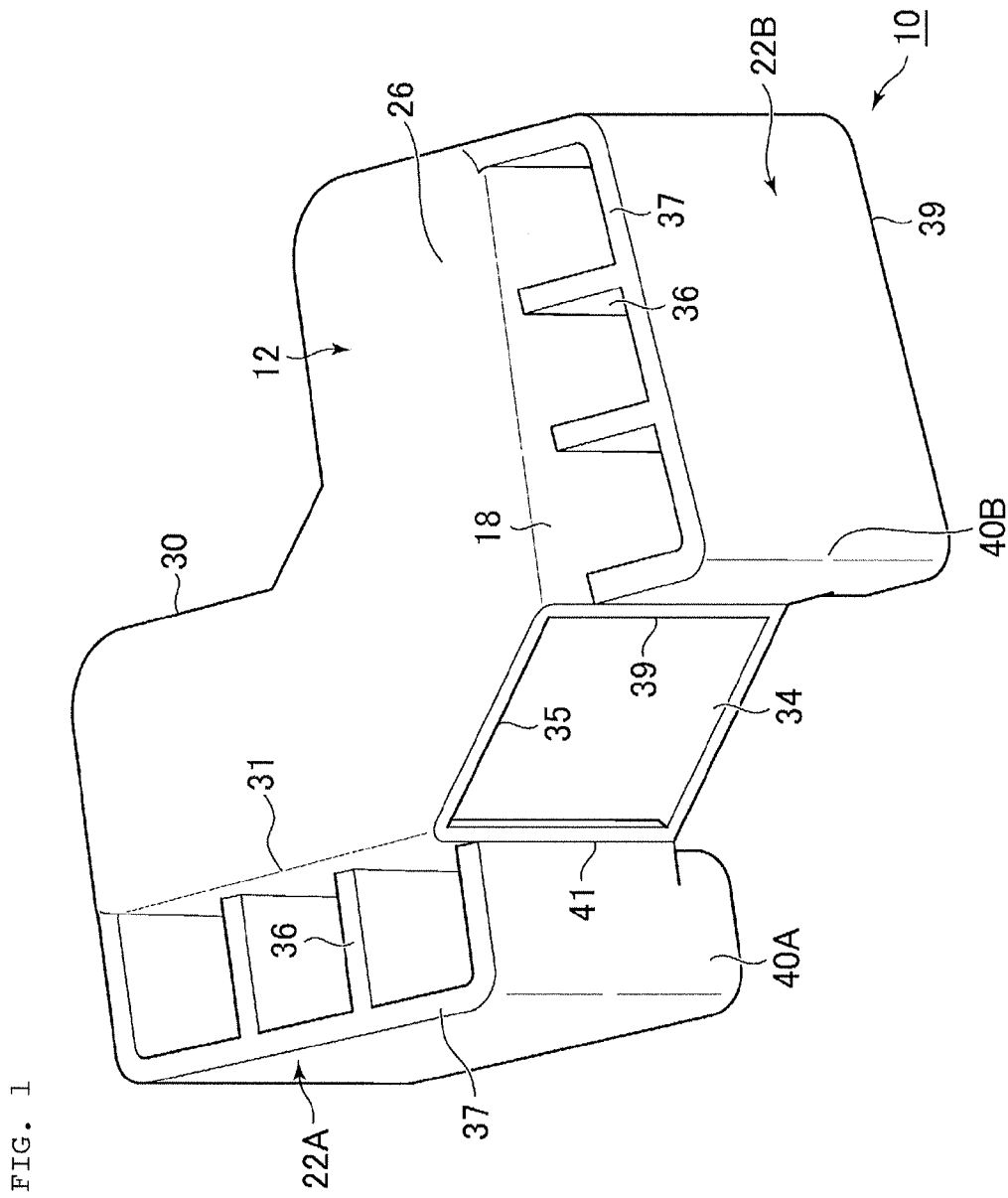
FIG. 1 is an entire perspective view illustrating a module 10 used for stacking solar panels P according to a first embodiment of the present invention.
Figure 2:
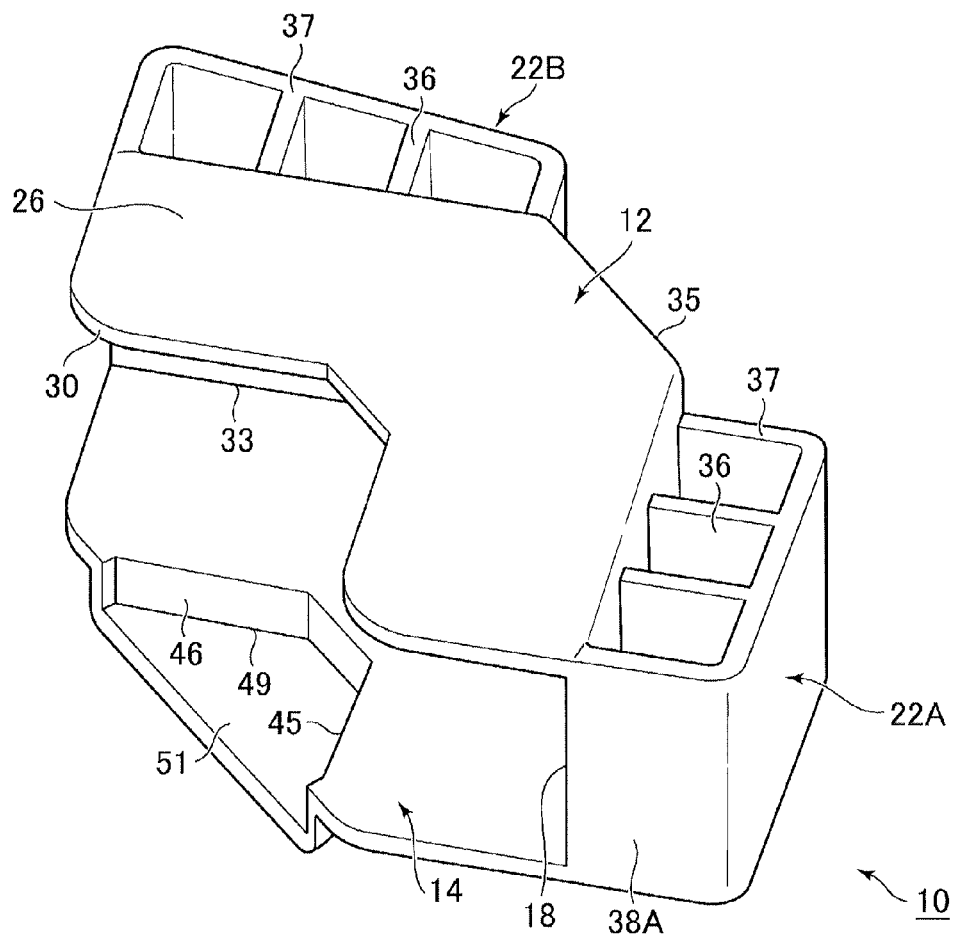
FIG. 2 is an entire perspective view illustrating the module 10 used for stacking solar panels P according to the first embodiment of the present invention.
Figure 3:
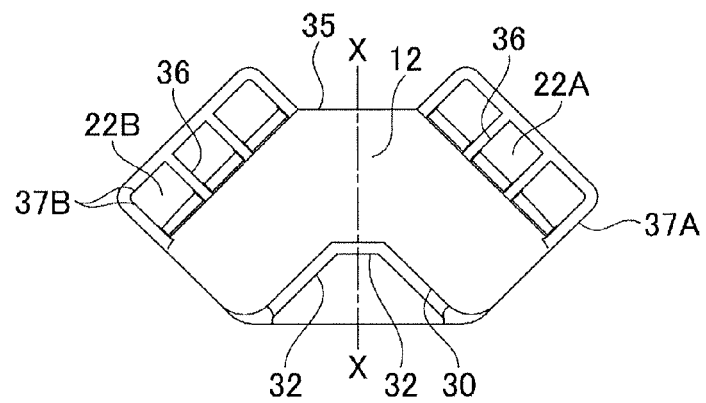
FIG. 3 is a plan view illustrating the module 10 used for stacking solar panels P according to the first embodiment of the present invention.
Figure 4:
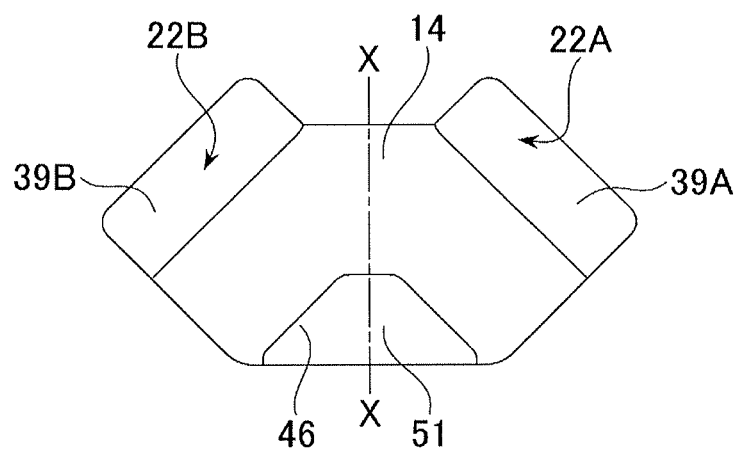
FIG. 4 is a bottom view illustrating the module 10 used for stacking solar panels P according to the first embodiment of the present invention.
Figure 5:
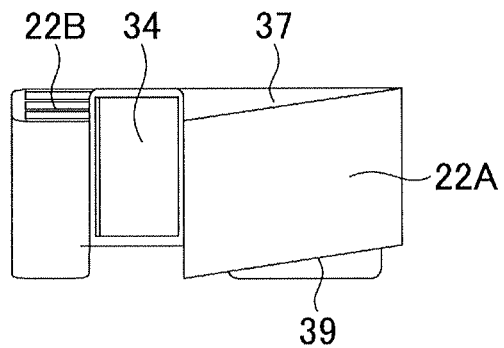
FIG. 5 is a side view illustrating the module 10 used for stacking solar panels P according to the first embodiment of the present invention.
Figure 6:
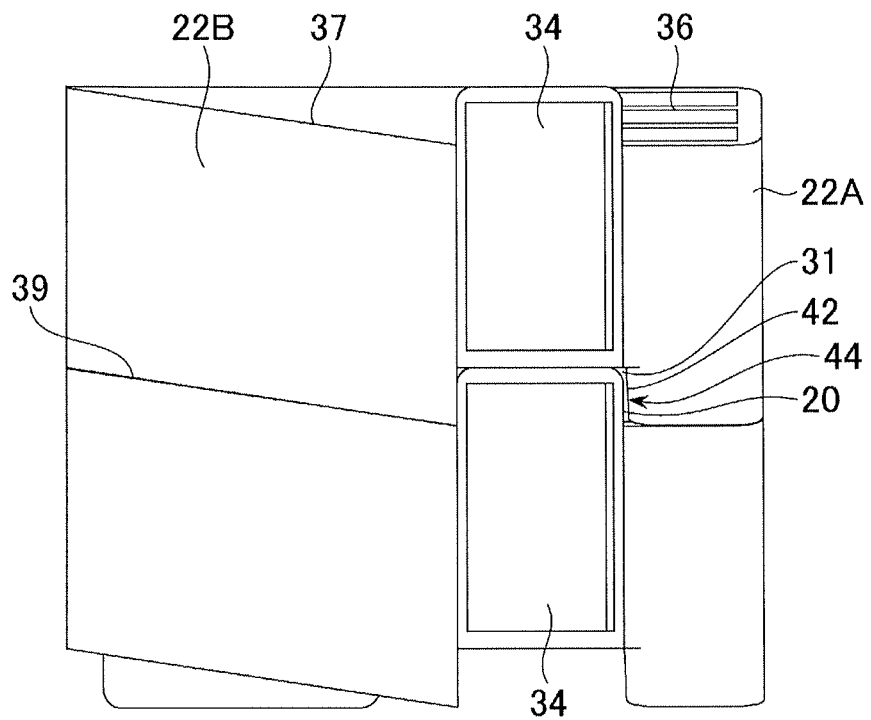
FIG. 6 is a partial schematic diagram, which is viewed from outside, illustrating stacked modules 10 used for stacking solar panels P according to the first embodiment of the present invention.
Figure 7:
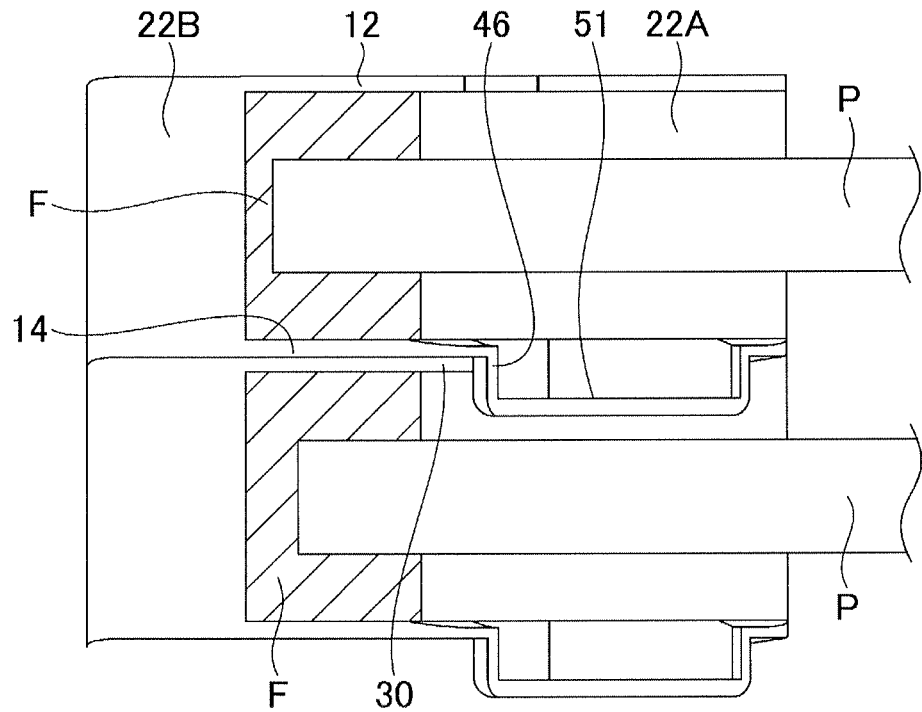
FIG. 7 is a partial schematic diagram, which is viewed from inside, illustrating stacked modules 10 used for stacking solar panels P according to the first embodiment of the present invention.
Figure 8:
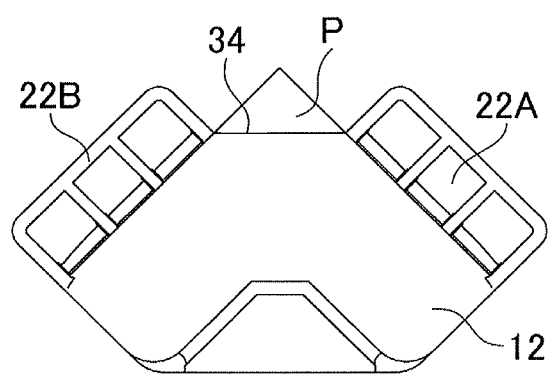
FIG. 8 is a partial schematic diagram illustrating the module 10, which is attached to a solar panel P, used for stacking solar panels P according to the first embodiment of the present invention.
Figure 9:
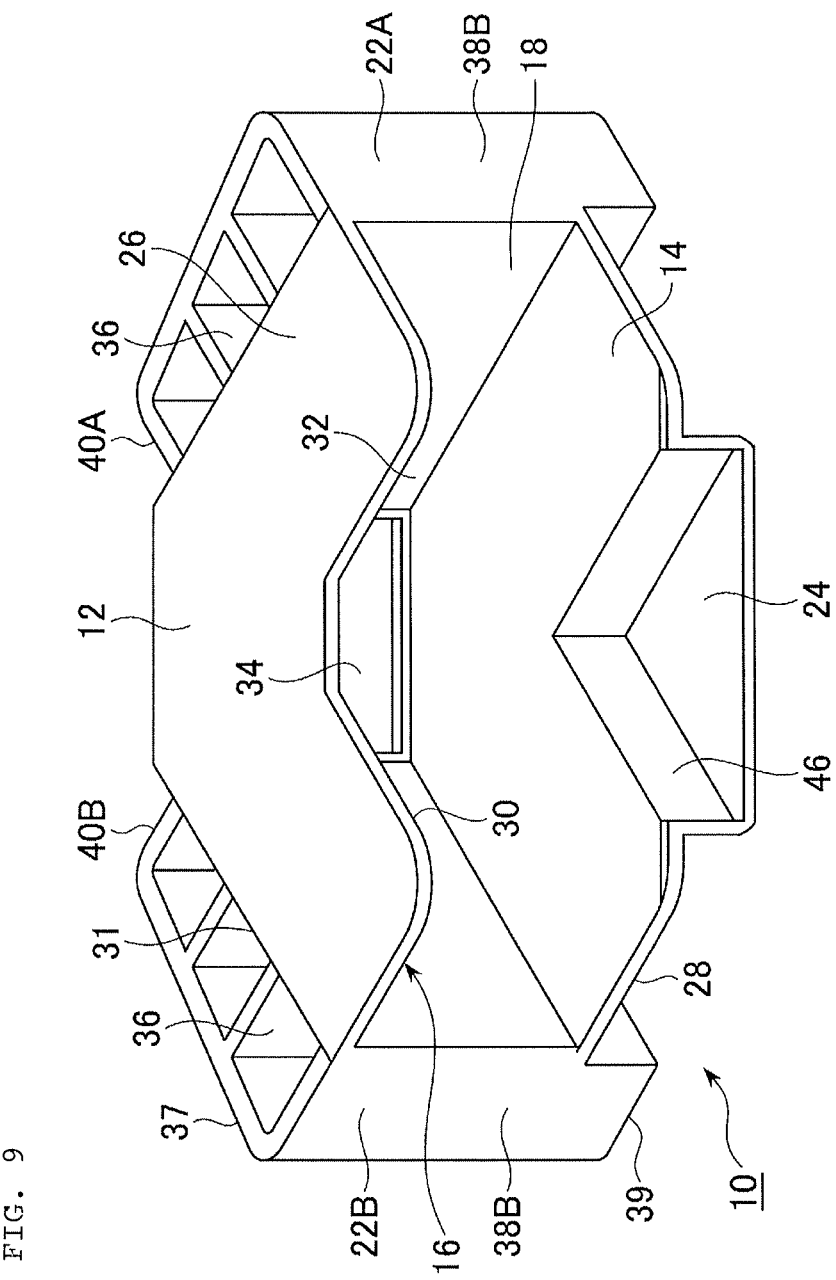
FIG. 9 is a view similar to FIG. 1 illustrating a module 10 used for stacking solar panels P according to a second embodiment of the present invention.
Figure 10:
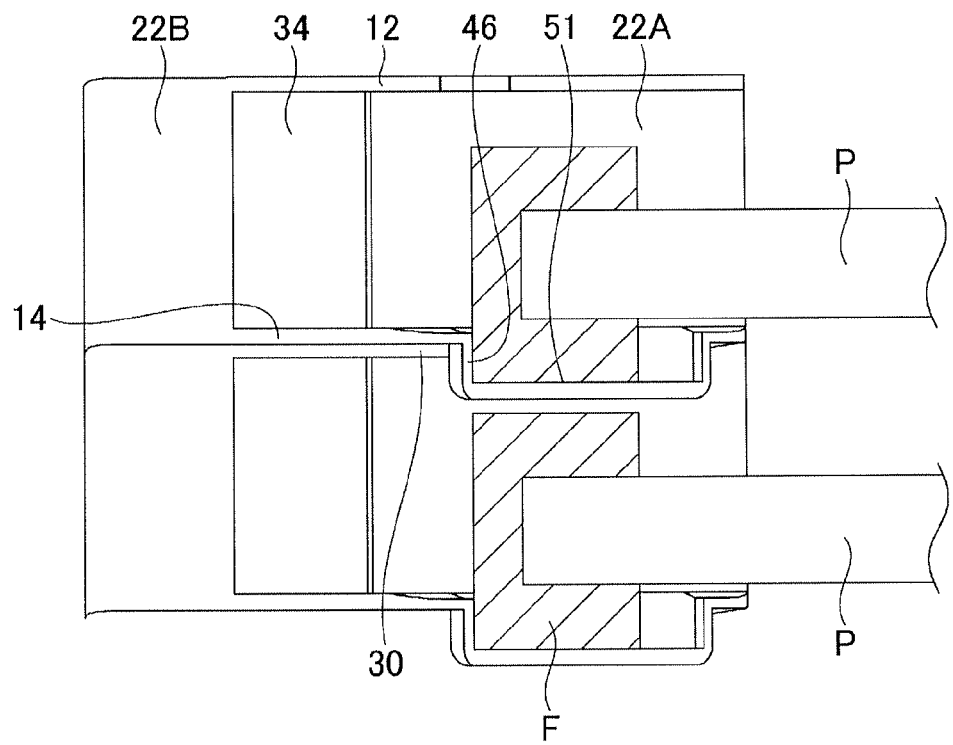
FIG. 10 is a view similar to FIG. 6 illustrating the modules 10 used for stacking solar panels P according to the second embodiment of the present invention.
Figure 11:
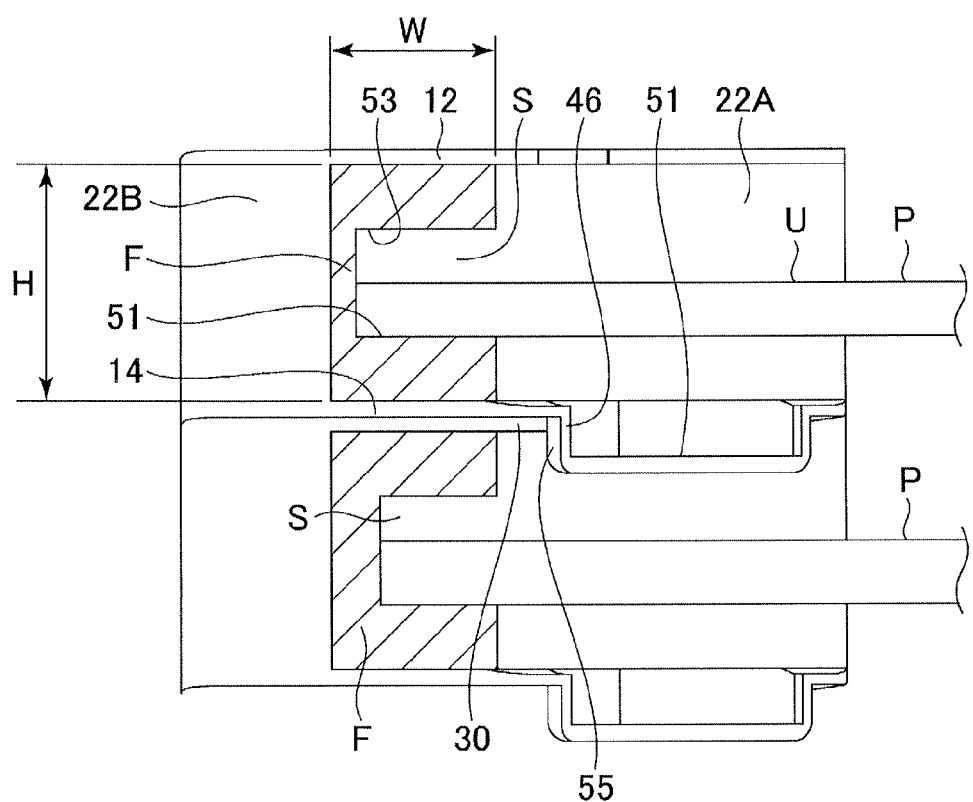
FIG. 11 is a partial schematic diagram, which is viewed from inside, illustrating stacked modules 10 used for stacking solar panels P according to a third embodiment of the present invention.
Figure 12:
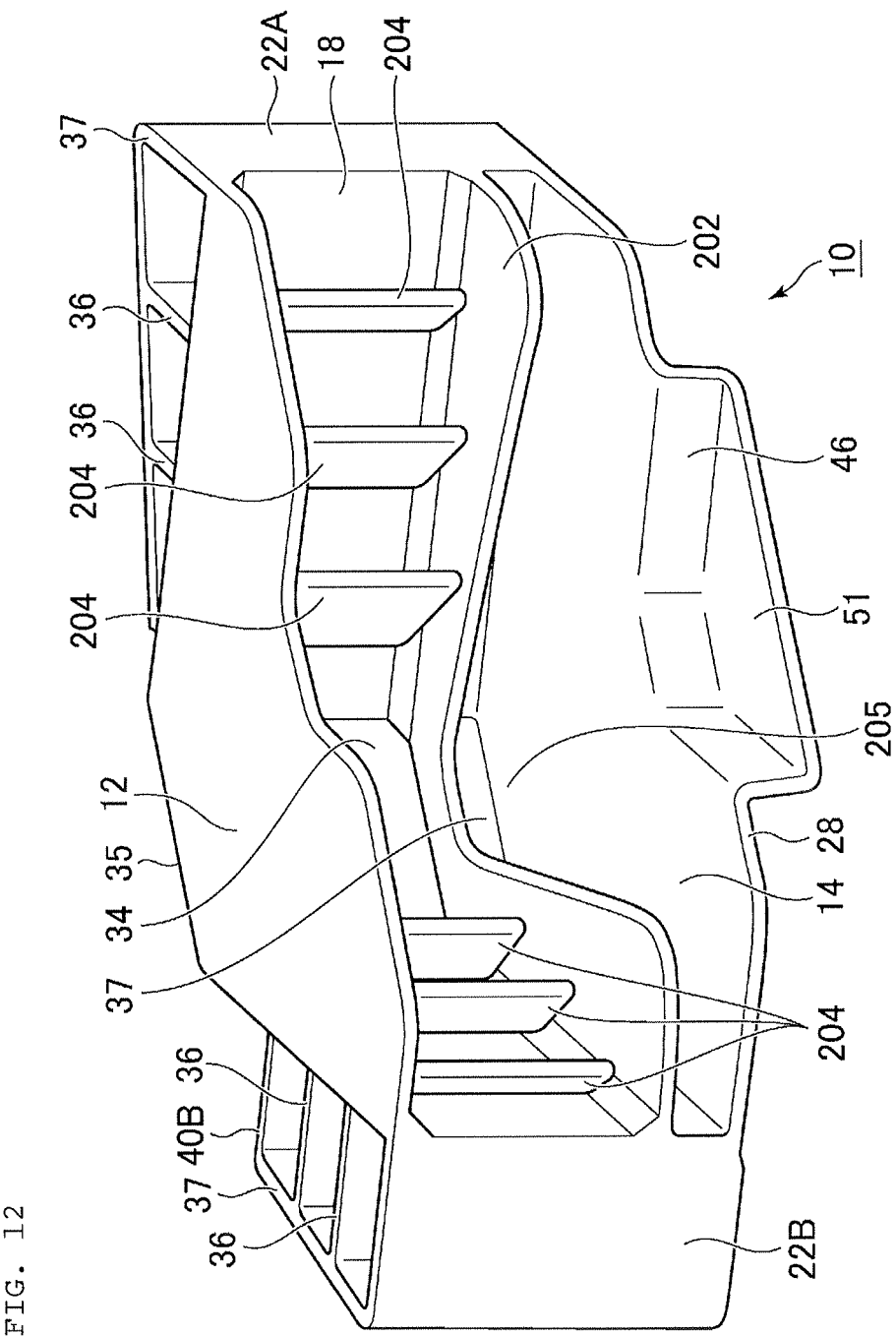
FIG. 12 is an entire perspective view, which is viewed from above, illustrating a module 10 used for stacking solar panels P according to a fourth embodiment of the present invention.
Figure 13:
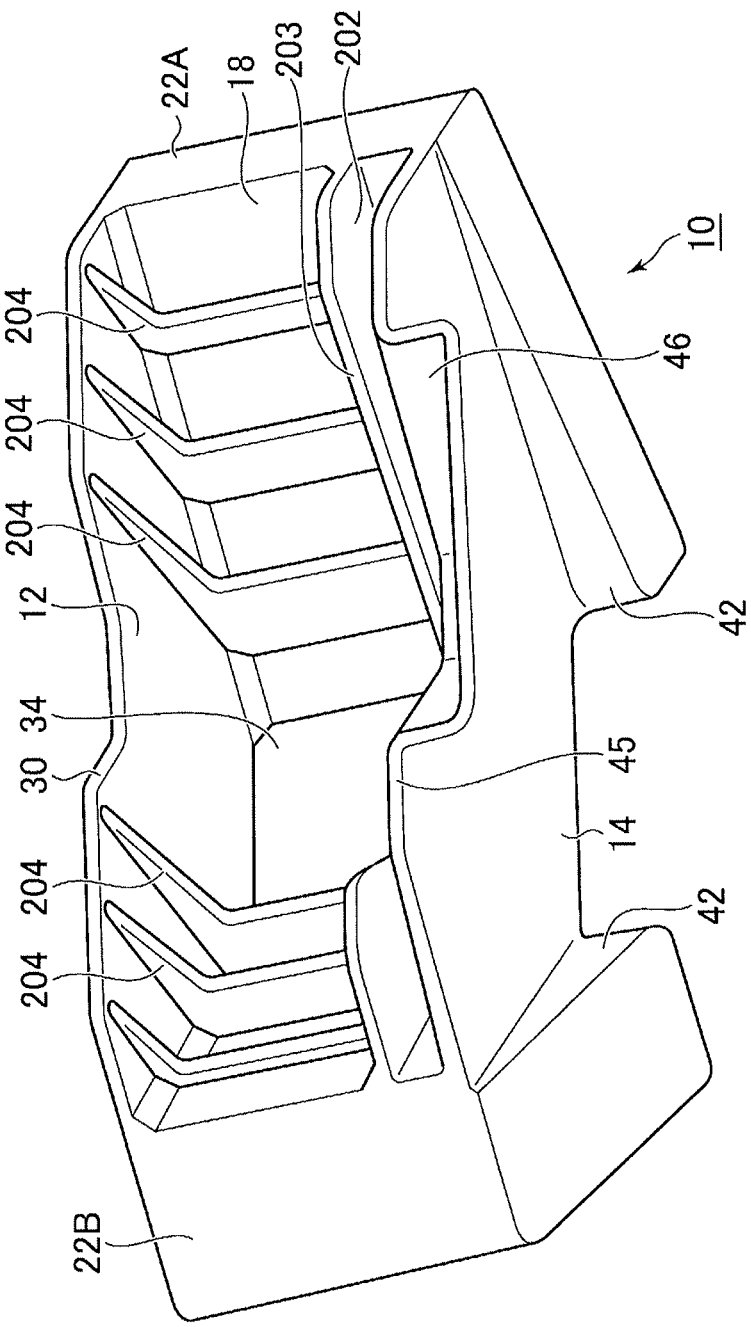
FIG. 13 is an entire perspective view, which is viewed from below, illustrating the module 10 used for stacking solar panels P according to the fourth embodiment of the present invention.

P Solar panel
F Metal frame body
10 Module
12 Upper plate-shaped body
14 Lower plate-shaped body
16 Plate-shaped body
18 Vertical wall
20 Outer surface
22 Box structure
24 Support surface
26 Top surface
28 Inferior surface
30 Inner edge
31 Outer edge
32 Notch
33 Outer edge
34 Opening
35 Outer edge
36 Rib
37 Top surface
38 One sidewall
39 Inferior surface
40 Other sidewall
42 Projecting inner surface
44 Outer rim
45 Inner edge
46 Inner rim
49 Lower edge
51 Reinforcing plate
202 Middle plate-shaped body
203 Inner edge
204 Longitudinal rib
205 Recess

The invention claimed is:

1. A module used for stacking thin panels, comprising:
a sandwiching support portion configured to sandwich and support the thin panel;
a load transmitting portion coupled with the sandwiching support portion, the load transmitting portion transmitting a weight of the thin panel in a vertical direction; and
a positioning portion configured to relatively position the thin panels in a horizontal direction, the thin panels being stacked in the vertical direction,
wherein:
the sandwiching support portion includes a lower plate-shaped body and a vertical wall, the lower plate-shaped body being disposed on a lower portion of the module, the vertical wall extending upward from an outer edge of the lower plate-shaped body to form an approximately C-shaped cross-sectional surface in conjunction with the lower plate-shaped body, the sandwiching support portion sandwiching and supporting the thin panel inserted from an opening of the C-shaped cross-sectional surface,
the load transmitting portion includes a load transmitting surface formed outward from an outer surface of the vertical wall,
the positioning portion includes an inner lock portion on an inner edge of the lower plate-shaped body, an outer lock portion on an outer edge of the lower plate-shaped body, and an upper plate-shaped body disposed on the upper portion of the module, the inner lock portion being contactable with an inner edge of the upper plate-shaped body, the outer lock portion being contactable with an outer edge of the upper plate-shaped body,
the sandwiching support portion includes the vertical wall that couples the outer edge of the upper plate-shaped body with the outer edge of the lower plate-shaped body to form the approximately C-shaped cross-sectional surface by the upper plate-shaped body and the lower plate-shaped body, and the sandwiching support portion is configured to sandwich and support the thin panel inserted between the lower plate-shaped body and the upper plate-shaped body from an opening of the C-shaped cross-sectional surface.

2. A module used for stacking thin panels, comprising:
a sandwiching support portion configured to sandwich and support the thin panel;
a load transmitting portion coupled with the sandwiching support portion, the load transmitting portion transmitting a weight of the thin panel in a vertical direction; and
a positioning portion configured to relatively position the thin panels in a horizontal direction, the thin panels being stacked in the vertical direction,
wherein:
the sandwiching support portion includes a lower plate-shaped body and a vertical wall, the lower plate-shaped body being disposed on a lower portion of the module, the vertical wall extending upward from an outer edge of the lower plate-shaped body to form an approximately C-shaped cross-sectional surface in conjunction with the lower plate-shaped body, the sandwiching support portion sandwiching and supporting the thin panel inserted from an opening of the C-shaped cross-sectional surface,
the load transmitting portion includes a load transmitting surface formed outward from an outer surface of the vertical wall,
the positioning portion includes an inner lock portion on an inner edge of the lower plate-shaped body, an outer lock portion on an outer edge of the lower plate-shaped body, and an upper plate-shaped body disposed on the upper portion of the module, the inner lock portion being contactable with an inner edge of the upper plate-shaped body, the outer lock portion being contactable with an outer edge of the upper plate-shaped body,
the sandwiching support portion includes the vertical wall that couples the outer edge of the upper plate-shaped body with the outer edge of the lower plate-shaped body to form the approximately C-shaped cross-sectional surface by the upper plate-shaped body and the lower plate-shaped body,
the upper plate-shaped body and the lower plate-shaped body each have an L shape with a notch at a corner portion, thereby forming an opening in the vertical wall, the opening including an outer edge corresponding to each of notches of the upper plate-shaped body and the lower plate-shaped body, and side edges of the vertical wall, the side edges facing each other and extending in the vertical direction, and
the thin panel is positioned to be in contact with the edges that form the opening and project from the opening when the thin panel is sandwiched and supported by the sandwiching support portion.

\* \* \* \* \*